(12) United States Patent
Takahashi et al.

(10) Patent No.: US 8,052,828 B2
(45) Date of Patent: Nov. 8, 2011

(54) PHOTOSENSITIVE LAMINATE FILM FOR FORMING TOP PLATE PORTION OF PRECISION FINE SPACE AND METHOD OF FORMING PRECISION FINE SPACE

(75) Inventors: Toru Takahashi, Kanagawa (JP); Atsushi Yamanouchi, Kanagawa (JP); Naoya Katsumata, Kanagawa (JP); Hiroki Maeda, Kanagawa (JP)

(73) Assignee: Tokyo Okha Kogyo Co., Ltd., Kawasaki-shi (JP)

( * ) Notice: Subject to any disclaimer, the term of this patent is extended or adjusted under 35 U.S.C. 154(b) by 1123 days.

(21) Appl. No.: 11/795,213

(22) PCT Filed: Jan. 23, 2006

(86) PCT No.: PCT/JP2006/301370
§ 371 (c)(1),
(2), (4) Date: Jul. 13, 2007

(87) PCT Pub. No.: WO2006/082762
PCT Pub. Date: Aug. 10, 2006

(65) Prior Publication Data
US 2008/0213596 A1    Sep. 4, 2008

(30) Foreign Application Priority Data

Jan. 21, 2005  (JP) .................................. 2005-014835
Feb. 23, 2005  (JP) .................................. 2005-047315

(51) Int. Cl.
*B32B 27/38* (2006.01)
*B32B 38/00* (2006.01)

(52) U.S. Cl. ...................... 156/272.2; 156/247; 428/413

(58) Field of Classification Search .................. 428/413; 156/247
See application file for complete search history.

(56) References Cited

U.S. PATENT DOCUMENTS

| 4,450,455 | A | 5/1984 | Sugitani et al. |
| 4,521,787 | A | 6/1985 | Yokota et al. |
| 5,476,752 | A | 12/1995 | Noguchi et al. |
| 6,140,006 | A | 10/2000 | Komatsu et al. |
| 6,361,155 | B1 | 3/2002 | Kanda et al. |
| 2002/0142249 | A1 * | 10/2002 | Ohshima ..................... 430/283.1 |
| 2002/0184761 | A1 | 12/2002 | Nishikawa et al. |
| 2004/0235992 | A1 * | 11/2004 | Okada et al. ................... 524/115 |
| 2005/0260522 | A1 * | 11/2005 | Weber et al. ............... 430/270.1 |
| 2006/0188820 | A1 * | 8/2006 | Maeda ........................... 430/311 |

FOREIGN PATENT DOCUMENTS

| GB | 2 157 622 | 10/1985 |
| GB | 2157622 A * | 10/1985 |
| JP | 52-117133 | 10/1977 |
| JP | 1985-190363 | 9/1985 |
| JP | 1987-004719 | 1/1987 |
| JP | 10-286955 | 10/1998 |
| JP | H11-190905 | 7/1999 |
| JP | 11-342607 | 12/1999 |
| JP | 2001-63052 | 3/2001 |
| JP | 2005-3979 | 1/2005 |
| TW | 200428167 | 12/2004 |

OTHER PUBLICATIONS

Office Action issued in corresponding Taiwan Application No. 095102333, mailed Nov. 21, 2008.
Notice of Reasons of Rejection issued in corresponding Japanese Patent Application No. 2005-047315, mailed Jul. 6, 2010.

* cited by examiner

*Primary Examiner* — Katarzyna Wyrozebski Lee
*Assistant Examiner* — Daniel Lee
(74) *Attorney, Agent, or Firm* — Knobbe Martens Olson & Bear LLP

(57) ABSTRACT

A photosensitive laminate film for forming a top plate portion, which is suitably used for efficiently and inexpensively forming various precision fine spaces, particularly the precision fine spaces formed in an electronic part such as inkjet head, and a method of forming the precision fine space using the photosensitive laminate film are provided. As the photosensitive laminate film for forming the top plate portion of the precision fine space, which constitutes the top plate portion of the precision fine space by being placed on the precision minute concave portion so as to cover an upper opening followed by being cured, a laminate film providing at least the photosensitive composition layer and the transparent support film is used. The transparent support film supports the photosensitive composition layer as well as prevents the photosensitive composition layer from being deformed upon curing.

8 Claims, No Drawings

United States Patent 8,052,828 B2

PHOTOSENSITIVE LAMINATE FILM FOR FORMING TOP PLATE PORTION OF PRECISION FINE SPACE AND METHOD OF FORMING PRECISION FINE SPACE

CROSS-REFERENCE TO RELATED APPLICATION

This application claims priority based on International Patent Application No. PCT/JP2006/301370, entitled "Photosensitive Laminate Film For Forming Top Plate Portion Of Precision Fine Space And Method Of Forming Precision Fine Space" by Toni Takahashi, Atsushi Yamanouchi, Naoya Katsumata and Hiroki Maeda, which claims priority of Japanese Application No. 2005-14385, filed on Jan. 21, 2005 and Japanese Application No. 2005-047315, filed on Feb. 23, 2005, and which were not published in English.

TECHNICAL FIELD

The present invention relates to a photosensitive laminate film for forming a top plate portion of a precision fine space, particularly various precision minute spaces formed in an electronic part such as inkjet head, and a method of forming the precision fine space.

BACKGROUND ART

Recently, technology to obtain various functions by forming precision minute spaces in various products has attracted much attention in industrial fields. For example, the technology to constitute precise and minute space in a semiconductor device and use an air layer present in this space as a dielectric substance layer, and the technology to make a liquid jetting apparatus in which numerous precision minute spaces are formed and a liquid such as ink filled in the minute spaces is jetted quantitatively and continuously by housing elements inside that produce pressure electrically or thermally have been developed. A typical example of the aforementioned liquid jetting apparatus is the inkjet head. In addition, a resist droplet jetting head which jets a resist solution as the droplet, and recently a DNA droplet jetting head which jets a DNA sample as the droplet have been provided.

Conventionally, the following method has been proposed as the method of forming the precision minute spaces such as jetting nozzle spaces of the aforementioned inkjet head and ink chambers for supplying the ink to the nozzle.

For example, as the method of forming consecutive precision minute spaces for a nozzle, an ink pressure chamber to extrude an ink to the nozzle, and an ink pool to supply the ink to the ink pressure chamber, the method of forming the above series of precision minute spaces by laminating multiple platy members with large and small pores, which form side walls of each space, and integrating with an adhesive agent is disclosed (Patent Document 1).

The method of forming the ink pressure chamber by forming a metal layer on a resin film, removing this metal layer intermittently by sandblasting and etching, and gluing platy members so as to surround resulting concave portions is also disclosed (Patent Document 2).

In addition, the method of forming the nozzle space by forming a head base having a concave portion which becomes the nozzle space by applying and laminating a resin composition on a concavo-convex surface of an original plate having concavo-convex portions and solidifying this and peeling from the above original plate, and subsequently gluing the platy members so as to surround the concave portions of this head base is disclosed (Patent Document 3)

In this way, the precision minute spaces such as nozzle spaces in the conventional inkjet head have been formed by forming penetrating holes in the platy member, or forming the concave portions by etching the metal layer or the resin layer to form the concave portions for minute space formation and gluing a top plate member so as to cover this concave portions. When an opening such as nozzle hole and a communicating path such as ink flow path are provided to the aforementioned top plate portion, the top plate has been previously perforated by etching and the like.

[Patent Document 1] Japanese Patent Application Laid-Open No. 2001-63052 A
[Patent Document 2] Japanese Patent Application Laid-Open No. HEI 11-342607 A
[Patent Document 3] Japanese Patent Application Laid-Open No. HEI 10-286955 A

DISCLOSURE OF THE INVENTION

Problem to be Solved by the Invention

Precision minute spaces typified by nozzle spaces and ink pressure chambers in the above inkjet head have been formed by gluing a platy member such as top plate so as to cover concave portions formed using some conventional molding procedure such as etching or die forming. Thus, when a penetrating hole or an opening is formed in a top plate portion, it is necessary that a perforation treatment has been previously given. Therefore, it is necessary to strictly control an accuracy of a perforated position, and the strict accuracy is also required for positioning upon adhesive bonding. Furthermore, an adhesive agent must be selected and used which does not modify a material that composes the concave portions and a material that composes the top plate portion, and glues both materials at a high degree.

For this reason, in the conventional methods of forming the precision minute spaces, many parts are used and production accuracy is strict, therefore, production steps are increased, selectivity of materials used is narrow, and consequently, it has been difficult to make the production efficient and reduce production cost.

The present invention has been made in the light of the above conventional circumstance, and it is an object of the invention to provide a photosensitive laminate film for forming a top plate portion, which is suitably used for efficiently and inexpensively forming various precision fine spaces, particularly the precision fine spaces formed in an electronic part such as inkjet head, and a method of forming the precision fine space using the photosensitive laminate film.

Means for Solving the Problem

As a result of conducting an extensive study for solving the above problems, the present inventors have found that the conventional problems may be avoided by using a dry film composed of a photosensitive composition in place of a platy member for a top plate portion in the conventional formation of precision minute spaces.

That is, it is possible to solve the above conventional problems if the dry film with high resolution, in other words, the dry film with low shrinkage in volume during a heat curing process, capable of forming a pattern having a profile with high aspect ratio, and using the photosensitive resin composition with high sensitivity is used as a material for forming the top plate portion. By the use of the aforementioned dry film, the top plate portion having high dimension accuracy may be formed, molding patterning can be performed simultaneously with the formation of the top plate portion when requiring a formation of an opening or a penetrating hole in the top plate portion, and consequently it may be easy to keep the dimension accuracy at a high level.

After searching resin compositions suitably used for such a dry film, the present inventors have found that the photosensitive resin composition obtained by combining a multifunctional epoxy resin with a specific acid generator is suitable for the dry film. It has been found that a resin pattern having the high sensitivity, the low shrinkage in volume during a heat curing process and the profile with high aspect ratio may be formed if the resin pattern is formed by using the dry film obtained from this photosensitive resin composition.

This dry film alone not only results in poor operability but also can not control the shrinkage by heat applied when cured. Thus, it has been found that it is important that the dry film has been supported by a predetermined support film, and additionally that it is also important that the dry film is retained by the support film not only at the operation such as attachment but also until a photosensitive resin composition layer is heated after exposure and cured. The preparation of the top plate portion is completed by completing the cure by heating after the exposure and peeling the support film followed by further heating to perform the main cure of the resin composition layer. When the pattern such as penetrating hole has been formed in this top plate portion, development is performed after peeling the support film, and subsequently the heating for the main cure is performed.

The present invention has been made based on the above findings, and the method of forming the precision fine space according to the present invention is characterized in that the precision fine space composed of a top plate portion made by curing a resin composition layer and a precision fine concave portion covered with this top plate portion is formed by laminating at least a photosensitive composition layer on a transparent support film to form a photosensitive laminate film, placing the photosensitive composition layer of the photosensitive laminate film so as to cover the precision fine concave portion, exposing the photosensitive composition layer through the support film without peeling the support film that supports the photosensitive composition layer, curing the exposed resin composition layer with heating, peeling the support film from the resin composition layer, and subsequently further giving a main cure with heating to the cured resin composition layer.

The photosensitive laminate film for forming the top plate portion of the precision fine space according to the present invention constitutes the top plate portion of the precision fine space by being placed on the precision minute concave portion so as to cover an upper opening followed by being cured, and is characterized by having at least the photosensitive composition layer and the transparent support film which supports the photosensitive composition layer as well as prevents the photosensitive composition layer from being deformed upon curing.

In the aforementioned support film, a vertical shrinkage rate by heating at 100° C. for 30 minutes is preferably 0.01% or more and 1% or less, and more preferably the vertical shrinkage rate by heating at 150° C. for 30 minutes is 4% or less or the vertical shrinkage rate by heating at 200° C. for 10 minutes is 3% or less. A lower limit of the vertical shrinkage rate is 0.01% because it is difficult to realize the vertical shrinkage rate of 0.01% or less in the production. A thickness thereof is preferably 6 to 350 μm, and more preferably 10 to 100 μm. Furthermore, a haze value thereof is preferably 0.1 to 5, and more preferably 0.1 to 3 (in the film with a thickness of 30 μm). As materials of this support film, specifically polyethylene terephthalate is suitable, and additionally polyethylene and polypropylene may also be used. It is preferable that a mold releasing treatment is given to the support film so as to easily peel as necessary.

The photosensitive composition which composes the aforementioned photosensitive composition layer is preferably a chemically amplified negative photosensitive resin composition.

The above chemically amplified negative photosensitive resin composition preferably comprises at least a multifunctional epoxy resin and a cation polymerization initiator.

As the above cation polymerization initiator, at least one selected from aromatic diazonium salts, aromatic sulfonium salts, aromatic iodonium salts, metallocene based compounds, aromatic phosphonium salts, silanol aluminium complexes is suitably used.

More specifically, at least one selected from two aromatic sulfonium salts represented by the following general formulae (1) and (2), respectively:

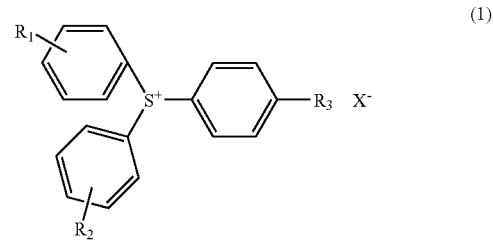

$X = SbF_6$ or $PF_6$

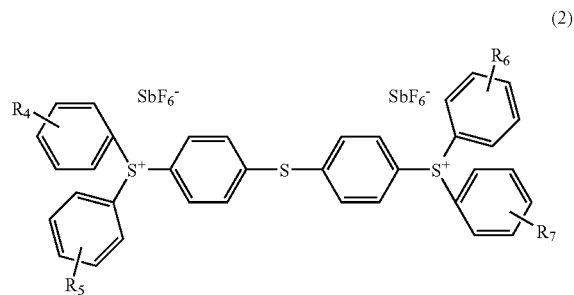

(in the fomurae, $R_1$, $R_2$, $R_4$, $R_5$, $R_6$ and $R_7$ represent hydrocarbon groups which may contain hydrogen, oxygen or halogen atoms, or alkoxy groups to which substituents may bond, and may be the same or different one another; and $R_3$ represents a hydrocarbon group which may contain hydrogen, oxygen or halogen atoms), may be suitably used.

$R_3$ in the above general formula (I) is preferably the hydrocarbon group represented by the following general formula (3):

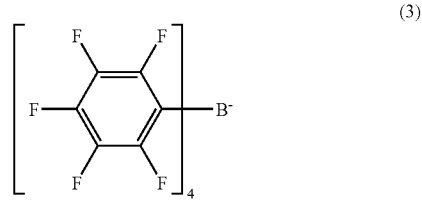

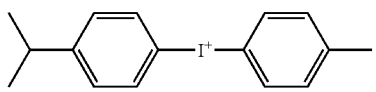

(in the fomura, $X_1$ is p-phenylene group whose hydrogen may be substituted with halogen or an alkyl group, and $X_2$ is a hydrocarbon group which may contain oxygen or halogen).

Examples of such a cation polymerization initiator may include compounds represented by the following general formula (4):

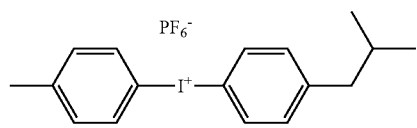

(4)

(in the fomura, $X_3$ and $X_4$ represent hydrogen atoms, halogen atoms, oxygen atoms or hydrocarbon groups which may contain halogen atoms, or alkoxy groups to which substituents may bond, and may be the same or different one another; and Y represents a hydrogen atom, a halogen atom, an oxygen atom or a hydrocarbon group which may contain a halogen atom or an alkoxy group to which substituents may bond).

Furthermore, as the aforementioned cation polymerization initiator, at least one selected from two aromatic iodonium salts represented by the following general formulae (5) and (6) may be suitably used.

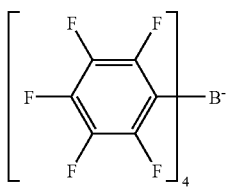

(5)

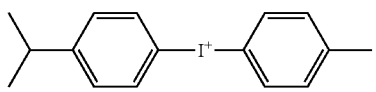

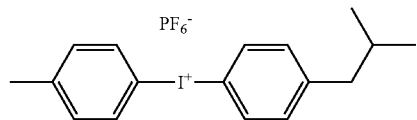

(6)

As the aforementioned multifunctional epoxy resin, a multifunctional bisphenol A novolak-type epoxy resin is suitable, and it is desirable that the above cation polymerization initiator is a compound represented by the following formula (7).

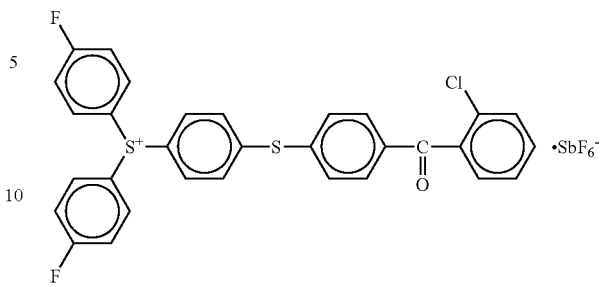

(7)

A linear polymeric bifunctional epoxy resin, a naphthol type sensitizer or γ-butyrolactone may be contained in the aforementioned photosensitive resin composition as necessary.

It is preferable that a surface protection film has been attached on the surface of the photosensitive composition layer, on which the support film is not attached. When a polyethylene terephthalate film is used as the support film, the above surface protection film may be any one selected from a polyethylene terephthalate film, a polypropylene film and a polyethylene film.

As mentioned above, the method of forming the precision minute space according to the present invention is characterized in that a precision fine space composed of a top plate portion made by curing a resin composition layer and a precision fine concave portion covered with this top plate portion is formed by placing the photosensitive composition layer of a photosensitive laminate film having the above constitution so as to cover the precision fine concave portion, exposing the photosensitive composition layer through a support film without peeling the support film which supports the photosensitive composition layer, curing the exposed resin composition layer with heating, giving a main cure with heating to the cured resin composition layer, and subsequently peeling the support film from the resin composition layer.

The aforementioned precision fine spaces are mainly formed within electronic parts. For example, the photosensitive laminate film and the method of forming the precision minute spaces according to the present invention may be used suitably for forming minute spaces for forming liquid jetting heads such as inkjet heads, resist droplet jetting heads and DNA droplet jetting heads, and additionally micropumps, micro optical allays, microswitches, micro relays, optical switches, micro flow meters, pressure sensors and the like.

Effect of the Invention

In accordance with the photosensitive laminate film for forming the top plate portion of the precision fine space and the method of forming the precision minute space according to the present invention, the following advantages may be obtained: the top plate portion excellent in dimension accuracy may easily be formed only by attaching the photosensitive laminate film so as to cover the concave portion for forming the minute space and giving a photo-curing thereto; furthermore, the perforation pattern having the profile with the high sensitivity, the low volume shrinkage upon thermal cure and the high aspect may be formed in this top plate portion; and consequently, the precision minute space having good dimension stability and multifunction may easily be formed.

BEST MODE(S) FOR CARRYING OUT THE INVENTION

Embodiments of the present invention will be described below.

A photosensitive resin composition suitably used for a photosensitive laminate film for forming a top plate portion of precision fine space according to the present invention is the photosensitive resin composition containing a multifunctional epoxy resin and the aforementioned cation polymerization initiator. By combining the multifunctional epoxy resin with the cation polymerization initiator, it is possible to form a resin pattern having a profile with a high sensitivity, a low shrinkage in volume during a heat curing process and a high aspect ratio. Various combinations thereof are possible, and among them, in particular, the combination of an octafunctional bisphenol A novolak epoxy resin (trade name: Epikote 157S70 supplied from Yuka Shell Epoxy K.K.) with 4-[4-(2-chlorobenzoyl)phenylthio]phenylbis(4-fluorophenyl)sulfonium hexafluoroantimonate, the compound represented by the above formula (7) (trade name: Adekaoptomer SP-172 supplied from Asahi Denka Co., Ltd.) is the most preferable when obtained advantages are considered.

Since the aforementioned cation polymerization initiator has a high production efficiency of cations by exposure to radiation, a relatively low amount contained is sufficient. Also, the cation polymerization initiator may widely enhance the sensitivity of the photosensitive resin composition by combining the above multifunctional epoxy resin. The cation polymerization initiator is presumed to have the above excellent advantages because the cation polymerization initiator has a special congeniality with the multifunctional epoxy resin, namely, the cation polymerization initiator is capable of attacking efficiently the epoxy group in the molecule of the multifunctional epoxy resin, particularly the above multifunctional bisphenol A novolak type epoxy resin to carry forward the polymerization. In addition, this combination has the advantage to reduce the shrinkage in volume of the photosensitive resin composition layer during a heat curing process. Therefore, by using the photosensitive resin composition of the present invention, it is possible to form the top plate portion of the precision minute space excellent in dimension accuracy and form the perforation pattern having the low shrinkage in volume during a heat curing process in this top plate portion, thereby being capable of realizing the precision fine space having high dimension stability.

The multifunctional epoxy resin in the photosensitive resin composition used for the present invention is not particularly limited as long as the epoxy resin contains the epoxy groups enough to form the pattern of a thick film in one molecule. Examples of such a multifunctional epoxy resin may include phenol novolak type epoxy resins, orthocresol novolak type epoxy resins, triphenyl novolak type epoxy resins, and bisphenol A (or F) novolak type epoxy resins. Among these compounds, the multifunctional bisphenol A novolak type epoxy resin is preferable. Functionality thereof is preferably five functions or more. Octa-functional bisphenol A novolak type epoxy resin ("Epikote 157S70" supplied from Japan Epoxy Resin Co., Ltd.) and a bisphenol A novolak type epoxy resin with average 6.4 functions ("Epiclone N-885" supplied from Dainippon Ink And Chemicals, Incorporated) are particularly preferable.

The aforementioned multifunctional bisphenol A (or F) novolak type epoxy resin is represented by the following general formula (8):

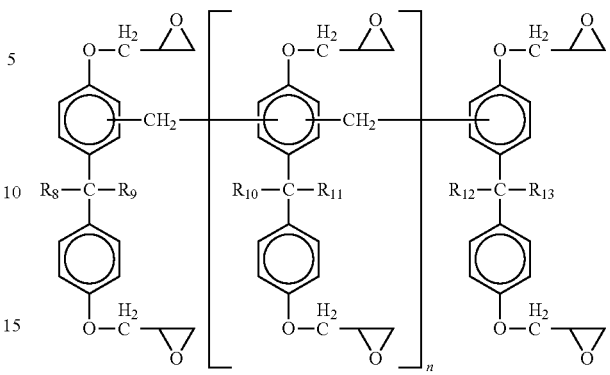

(8)

(The epoxy groups of the aforementioned bisphenol A (or F) novolak type epoxy resin may be a polymer obtained by polymerizing with the bisphenol A (or F) type epoxy resin or the bisphenol A (or F) novolak type epoxy resin. In the above formula (8), $R_8$ to $R_{13}$ are H or $CH_3$, and n is 0 or an integer.)

A softening point of the aforementioned multifunctional epoxy resin is not particularly limited as long as the resin is solid at an ambient temperature. When a dry film resist is formed, if the photosensitive composition is softened at an ambient temperature (about 25°), it becomes not easy to store and transport and the photosensitive composition must be softened by heating upon lamination. In these regards, the softening point of the multifunctional epoxy resin is preferably about 50 to about 100° C., and more preferably about 60 to 80° C.

When a composition ratio of the multifunctional epoxy resin in the photosensitive resin composition is too high, a film is not usable because the sensitivity is too low when the composition is formed into the film. Conversely, the case of being excessively low composition ratio is not preferable because a coated film becomes fragile when cured. In these regards, the above composition ratio is preferably about 50 to about 99.9%, and more preferably about 70 to about 99.4%.

The cation polymerization initiator in the photosensitive resin composition used for the present invention produces cations by being irradiated with radiation such as ultraviolet ray, far ultraviolet ray, excimer laser such as KrF and ArF, X-ray and electron ray, and the cation can become the polymerization initiator. Specifically, the cation polymerization initiator is at least one selected from aromatic diazonium salts, aromatic sulfonium salts, aromatic iodonium salts, metallocene based compounds, aromatic phosphonium salts and silanol aluminium complexes as described above.

More particularly, the salts represented by the above general formulae (1) to (6) are suitable for the aforementioned cation polymerization initiator.

Examples of the cation polymerization initiator, more specifically examples of the aromatic sulfonium salt based cation polymerization initiator may include 4-(4-benzoylphenylthio)phenyldiphenylsulfonium hexafluoroantimonate, 4-(4-benzoylphenylthio)phenylbis(4-hydroxyethyloxyphenyl)sulfonium hexafluoroantimonate, 4-(4-benzoylphenylthio)phenylbis(4-fluorophenyl)sulfonium hexafluoroantimonate, 4-(4-benzoylphenylthio)phenylbis(4-chlorophenyl)sulfonium hexafluoroantimonate, 4-[4-(3-chlorobenzoyl)phenylthio]phenylbis(4-fluorophenyl)sulfonium hexafluoroantimonate, 4-(4-benzoylphenylthio)phenylbis(4-methylphenyl)sulfonium hexafluoroantimonate, 4-(4-benzoylphenylthio)phenylbis(4-hydroxyethylphenyl)sulfonium hexafluoroantimonate, 4-[4-(4-hydroxyethyloxybenzoyl) phenylthio]phenylbis(4-fluorophenyl)sulfonium hexafluoroantimonate, 4-[4-(4-hydroxyethyloxybenzoyl)phenylthio] phenyldiphenylsulfonium hexafluoroantimonate, 4-[4-(4-hydroxyethyloxybenzoyl)phenylthio]phenylbis(4-hydroxyethyloxyphenyl)sulfonium hexafluoroantimonate, 4-(4-benzoylphenylthio)phenylbis(4-methoxyethoxyphenyl)sulfonium hexafluoroantimonate, 4-[4-(3-methoxybenzoyl)phenylthio]phenyldiphenylsulfonium hexafluoroantimonate, 4-[4-(3-methoxycarbonylbenzoyl)phenylthio] phenyldiphenylsulfonium hexafluoroantimonate, 4-[4-(2-hydroxymethylbenzoyl)phenylthio] phenyldiphenylsulfonium hexafluoroantimonate, 4-[4-(4-methylbenzoyl)phenylthio]phenylbis(4-fluorophenyl) sulfonium hexafluoroantimonate, 4-[4-(4-methoxybenzoyl) phenylthio]phenylbis(4-fluorophenypsulfonium hexafluoroantimonate, 4-[4-(4-fluorobenzoyl)phenylthio] phenylbis(4-fluorophenypsulfonium hexafluoroantimonate, 4-[4-(2-methoxycarbonylbenzoyl)phenylthio]phenylbis(4-fluorophenypsulfonium hexafluoroantimonate, bis[4-(diphenylsulfonio)phenyl]sulfide bishexafluorophosphate, bis[4-(diphenylsulfonio)phenyl]sulfide bistetrafluoroborate, bis[4-(diphenylsulfonio)phenyl]sulfide tetrakis (pentafluorophenyl)borate, diphenyl-4-(phenylthio) phenylsulfonium hexafluorophosphate, diphenyl-4-(phenylthio)phenylsulfonium tetrafluoroborate, diphenyl-4-(phenylthio)phenylsulfonium tetrakis(pentafluorophenyl) borate, triphenylsulfonium hexafluorophosphate, triphenylsulfonium hexafluoroantimonate, triphenylsulfonium tetrafluoroborate, triphenylsulfonium tetrakis(pentafluorophenyl)borate, bis[4-(di(4-(2-hydroxyethoxy))phenylsulfonio)phenyl]sulfide bishexafluorophosphate, bis[4-(di(4-(2-hydroxyethoxy))phenylsulfonio)phenyl]sulfide bistetrafluoroborate, and bis[4-(di(4-(2-hydroxyethoxy)) phenylsulfonio)phenyl]sulfide tetrakis(pentafluorophenyl) borate. Among these compounds, 4-(4-benzoylphenylthio) phenyldiphenylsulfonium hexafluoroantimonate, 4-(4-benzoylphenylthio)phenylbis(4-hydroxyethyloxyphenyl) sulfonium hexafluoroantimonate, 4-(4-benzoylphenylthio) phenylbis(4-fluorophenyl)sulfonium hexafluoroantimonate, 4-(4-benzoylphenylthio)phenylbis(4-chlorophenyl)sulfonium hexafluoroantimonate and 4-[4-(3-chlorobenzoyl)phenylthio]phenylbis(4-fluorophenyl)sulfonium hexafluoroantimonate are more preferable. "Adekaoptomer SP-172" supplied from Asahi Denka Co., Ltd., "4-[4-(2-chlorobenzoyl)phenylthio]phenylbis(4-fluorophenyl)sulfonium hexafluoroantimonate", "Adekaoptomer SP-170" supplied from Asahi Denka Co., Ltd. are preferably used.

Examples of the iodonium salt based cation polymerization initiator may include diphenyliodonium hexafluorophosphate, diphenyliodonium hexafluoroantimonate, diphenyliodonium tetrafluoroborate, diphenyliodonium tetrakis (pentafluorophenyl)borate, bis(dodecylphenyl)iodonium hexafluorophosphate, bis(dodecylphenyl)iodonium hexafluoroantimonate, bis(dodecylphenyl)iodonium tetrafluoroborate, bis(dodecylphenyl)iodonium tetrakis(pentafluorophenyl)borate, 4-methylphenyl-4-(1-methylethyl) phenyliodonium hexafluorophosphate, 4-methylphenyl-4-(1-methylethyl)phenyliodonium hexafluoroantimonate, 4-methylphenyl-4-(1-methylethyl)phenyliodonium tetrafluoroborate, and 4-methylphenyl-4-(1-methylethyl)phenyliodonium tetrakis(pentafluorophenyl)borate. Among these compounds, "DI-1" and "DI-2" supplied from Ciba Specialty Chemicals are preferably used.

Examples of the diazonium salt based cation polymerization initiator may include phenyldiazonium hexafluorophosphate, phenyldiazonium hexafluoroantimonate, phenyldiazonium tetrafluoroborate and phenyldiazonium tetrakis (pentafluorophenyl)borate.

When the composition ratio of the cation polymerization initiator in the photosensitive resin composition is too high, the development of the resin composition becomes difficult. Conversely, when the composition ratio is too low, a curing time of the resin composition by radiation exposure becomes long. Considering these points, the above composition ratio is preferably about 0.1 to about 10%, and more preferably about 0.5 to about 5%.

A linear polymeric bifunctional epoxy resin may be contained in the aforementioned photosensitive resin composition for improving an film forming property.

The aforementioned linear polymeric bifunctional epoxy resin is represented by the following general formula (9):

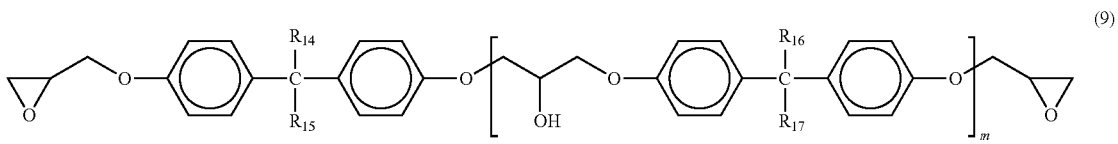

(In the formula (9), $R_{14}$ to $R_{17}$ are H or $CH_3$, and m is an integer.)

The linear polymeric bifunctional epoxy resin is not particularly limited, and is one obtained by polymerizing bisphenol A type epoxy resin or bisphenol F type epoxy resin. An average molecular weight thereof is preferably 2,000 to 7,000, and more preferably 3,000 to 5,000. When the average molecular weight is less than 2,000, the film forming property is not improved. When the average molecular weight is more than 7,000, the linear polymeric bifunctional epoxy resin is not compatible with the multifunctional epoxy resin. Specifically, the bisphenol A type epoxy resin ("Epikote 1009" having the average molecular weight of 3,750 supplied from Japan Epoxy Resin Co., Ltd.) is particularly preferable.

A naphthol type sensitizer may be further contained in the photosensitive resin composition. When the sensitivity is high, if there are gaps between a mask and a resist surface, the dimension of a resin pattern resulted from the exposure becomes thicker than the mask dimension. This thickening phenomenon may be inhibited without decreasing the sensitivity by containing the naphthol type sensitizer. It is preferable to add the naphthol type sensitizer in this way because an error of the resist pattern dimension for the mask pattern dimension may be reduced.

Examples of such a naphthol type sensitizer may include 1-naphthol, β-naphthol, α-naphthol methyl ether and α-naphthol ethyl ether. Considering the advantage to inhibit the thickening of the resist without decreasing the sensitivity, the most preferable is 1-naphthol.

When the composition ratio of the naphthol type sensitizer in the photosensitive resin composition is too high, such a case is not preferable because the resist becomes a reverse taper shape and a line width becomes excessively thin. Considering these points, the above composition ratio is preferably about 0 to about 10%, and more preferably about 0.1 to about 3%.

A solvent may be further contained in the photosensitive resin composition. The sensitivity of the photosensitive resin composition may be enhanced by containing the solvent. Examples of such a solvent may include propylene glycol monomethylether acetate (hereinafter, abbreviated as "PGMEA"), methyl isobutyl ketone (hereinafter, abbreviated as "MIBK"), butyl acetate, methyl amyl ketone(2-heptanone), ethyl acetate and methyl ethyl ketone (hereinafter, abbreviated as "MEK").

Among the above solvents, γ-butyrolactone is preferable in the case of the liquid resist in terms of reacting with and being incorporated in the resist, and PGMEA, MIBK, butyl acetate and MEK are preferable in terms of wettability with a substrate film and surface tension when it is considered to mold into a dry film.

An oxetane derivative and an epoxy derivative may be further contained in the photosensitive resin composition. A flexibility of the photosensitive resin composition before the cure may be enhanced without decreasing the physical property of the photosensitive resin composition after the cure when molded into a dry film by containing the oxetane derivative or the epoxy derivative. Such an oxetane derivative is not particularly limited, and specific examples thereof may include 3-ethyl-3-hydroxymethyloxetane, 1,4-bis{[(3-ethyl-3-oxetanyl)methoxy]methyl}benzene and di[1-ethyl(3-oxetanyl)]methyl ether. Examples of such an epoxy derivative may include bisphenol A type epoxy resins and bisphenol F type epoxy resins having the average molecular weight of 7,000 or less, preferably 2,000 or less, and more preferably 1,000 or less. Specific example thereof may include the bisphenol A type epoxy resin ("Epikote 828", average molecular weight 380, supplied from Japan Epoxy Resin Co., Ltd.).

Further, miscible additives, for example, additive resins for improving the pattern performance, plasticizers, stabilizers, coloring agents and surfactants commonly used may be contained as desired in the photosensitive resin composition used for the photosensitive laminate film of the present invention.

The thickness of the photosensitive resin layer is preferably 2 to 500 μm, and more preferably 5 to 200 μm.

To obtain the photosensitive laminate film from the photosensitive resin composition, a dry film whose both sides are protected with resin films may be formed from the photosensitive resin composition, and attached on a member having desired fine concave portions before the pattern exposure. When a polyethylene terephthalate film is used for the support film, it is preferable to use any polymer film of a polyethylene terephthalate film, a polypropylene film and a polyethylene film as the surface protection film.

The support film supports the photosensitive resin composition layer during the period from before exposing to after completely curing the photosensitive resin composition layer as described later. Thus, it is important to have the predetermined heat shrinkage rate, the predetermined thickness and the predetermined haze value as described above.

As the heat shrinkage rate of the support film, the vertical shrinkage rate at 100° C. for 30 minutes is 0.01% or more and 1% or less, and preferably the vertical shrinkage rate at 150° C. for 30 minutes is 4% or less or the vertical shrinkage rate at 200° C. for 10 minutes is 3% or less. A lower limit of the vertical shrinkage rate is 0.01% because it is difficult to realize the vertical shrinkage rate of 0.01% or less in the production. The thickness of the support film is preferably 6 to 350 μm. When the thickness is 6 μm or less, the support film can not adequately support the photosensitive resin composition layer. Conversely, when the thickness is 350 μm or more, such a case is not desirable because not only the operability becomes poor but also a transmissivity of exposed light is decreased. The haze value of the support film is preferably 0.1 to 5, and more preferably 0.1 to 3 (in the film with a thickness of 30 μm).

A favorable resin pattern that is faithful to the mask pattern may be formed without depending on the shape of the member having concave portions by attaching the photosensitive laminate film of the present invention obtained from the photosensitive resin composition on the member having the desired fine concave portions, giving pattern exposure by radiation to the photosensitive resin composition layer without peeling the support film thereof, then, facilitating the cure with heating, subsequently peeling the support film and developing with a developing solution. For this reason, it becomes possible to realize the formation of the precision minute space provided within the electronic device such as inkjet recording head, with excellent dimension stability.

EXAMPLES

The present invention will be described with reference to the following Examples, but these Examples are only exemplifications for suitably describing the invention and do not limit the invention.

Examples 1, 2 and 3, and Comparative Example 1

(Photosensitive Resin Composition)
In accordance with the composition (units were parts by weight) described in Table 1 and paragraphs described later, photosensitive resin compositions in which a multifunctional epoxy resin, a cation polymerization initiator and other ingredients had been dissolved and mixed in PGMEA were obtained.

(Patterning of Photosensitive Resin Composition)
A photosensitive laminate film (hereinafter, referred to as "DFR" [dry film resist]) having a photosensitive resin composition layer with a thickness of 30 μm was formed by uniformly applying the photosensitive resin composition on a support film, a polyethylene terephthalate (PET) film with a thickness of 50 μm having a mold releasing agent (Purex A-53 supplied from Teijin DuPont Films Japan Ltd., heat shrinkage rates at 100° C. for 30 minutes and at 200° C. for 10 minutes: 1% or less and 2.2%, respectively), drying at 65° C. for 5 minutes and at 80° C. for 5 minutes using a warm air convection dryer, and subsequently laminating PET with a thickness of 25 μm having the mold releasing agent (Purex A-31 supplied from Teijin DuPont Films Japan Ltd.) as a protection film on an exposed surface.

The protection film of this DFR was peeled, and the DFR was laminated on a wafer on which lines and spaces had been patterned at a roll temperature of 80° C., at an air pressure of 2 kg/cm$^2$ and at a speed of 0.5 m/minute. The lines and spaces had a line width of 200 μm, a space width of 200 μm and a height of 400 (For constituents of this lines and spaces, see the following Table 1. The photosensitive composition in a liquid or a film form was applied/dried or laminated, and subsequently formed into the desired line and space pattern by exposure and heated (PEB, post exposure baking) followed by being developed.) Pattern exposure (proximity: GHI ray, exposure intensity 400 mJ/cm$^2$) was given to a photosensitive resin layer of the laminated laminate film using Arallel light aligner (Mask Aligner supplied from Canon Inc.). The patterning at that time was performed so that cured portions closed up every other space of the lines and spaces. Subsequently, heating (hereinafter, referred to as "PEB") at 90° C. for 5 minutes was given on a hotplate. The support film of the laminating film was peeled, which was then developed for 4 minutes by an immersion method using PGMEA. Subsequently, post baking was performed at 200° C. for one hour using an oven to result in a precision fine space pattern on a substrate. In this pattern, every other space of the multiple spaces in the lines and spaces was closed up with the cured portions of the photosensitive resin layer.

(Evaluation of Photosensitive Resin Composition)

After the development, heat trailing by PEB and position accuracy of a top plate were visually evaluated as follows. Results are shown in the following Table 1. The visual evaluation was performed by observing the space in the lines and spaces from a thickness direction of the wafer under a microscope. A reason why the lines and spaces were selected as the concave portions of the precision fine spaces is that if a space portion for the measurement is cut, deformation occurs by cutting and thus the accuracy of the top plate portion can not be correctly evaluated. The heat trailing was evaluated by visually observing whether an inside bottom face in the cured resin layer which had covered the space portion as the top plate was deformed or not. For the position accuracy of the top plate, the case visually confirmed that a width dimension of the cured resin layer which had covered each space portion as the top plate was not deviated from a space dimension was determined as the good case whereas the case confirmed that it was deviated from the space dimension was determined as the bad case.

TABLE 1

|  | Example 1 | Example 2 | Example 3 | Comparative Example 1 |
|---|---|---|---|---|
| Photosensitive composition | A | A | B | A |
| Peeling of support film | After PEB | After PEB | After PEB | Before PEB |
| Material of concave portion | Photosensitive composition A | silicone | Photosensitive composition A | Photosensitive composition A |
| Heat trailing by PEB | No | No | No | Yes |
| Position accuracy of a top plate | Good | Good | Good | Bad |

| (Photosensitive composition A) | |
|---|---|
| Epoxy resin: multifunctional bisphenol A novolak type epoxy resin (Epikote 157S70 supplied from Japan Epoxy Resin Co., Ltd.) | 100 parts by weight |
| Cation polymerization initiator: Adekaoptomer SP172 supplied from Asahi Denka Co., Ltd. | 3 parts by weight |
| (Photosensitive composition B) | |
| Epoxy resin: multifunctional bisphenol A novolak type epoxy resin (Epikote 157S70 supplied from Japan Epoxy Resin Co., Ltd.) | 80 parts by weight |
| Epoxy resin: bisphenol A type epoxy derivative (Epikote 828 supplied from Japan Epoxy Resin Co., Ltd.) | 20 parts by weight |
| Cation polymerization initiator: Adekaoptomer SP172 supplied from Asahi Denka Co., Ltd. | 3 parts by weight |
| 1-Naphthol: | 1 part by weight |

Example 4

Precision fine spaces were formed by the same way as in Example 3, except that a punched hole pattern of 50 μmφ was exposed in the top plate. The punched hole pattern was exposed on a laminated laminate film, which was then heated at 90° C. for 5 minutes on the hotplate. A support film was peeled from the laminate film, which was then developed for 12 minutes by the immersion method using PGMEA. Subsequently, the post baking (heating for the main cure) was performed at 200° C. for one hour to obtain a precision fine space pattern on a substrate. In the obtained top plate, there was no heat trailing and the top plate accuracy was favorable. In addition, a shape of the hole in the top plate was also favorable.

INDUSTRIAL APPLICABILITY

As described above, in accordance with the photosensitive laminate film for forming the top plate portion of the precision fine space and the method of forming the precision minute space according to the present invention, the following advantages may be obtained: the top plate portion excellent in dimension accuracy may be easily formed only by attaching the photosensitive laminate film so as to cover the concave portion for forming the minute space and giving a light cure thereto; furthermore, the perforation pattern having the profile with the high sensitivity, the low shrinkage in volume upon thermal cure and the high aspect ratio may be formed in this top plate portion; and consequently the precision minute space having good dimension stability and multifunction may be easily formed. Therefore, in accordance with the present invention, the minute spaces for forming liquid jetting heads such as inkjet heads, resist droplet jetting heads and DNA droplet jetting heads, and additionally micropumps, micro optical allays, microswitches, micro relays, optical switches, micro flow meters, pressure sensors and the like may be formed precisely and easily.

The invention claimed is:

1. A method for forming a precision fine space formed by a precision fine concave portion and a top plate covering the precision fine concave portion, comprising:

laminating at least a photosensitive composition layer on a transparent support film to form a photosensitive laminate film;

placing the photosensitive laminate film on the precision fine concave portion so as to cover the precision fine concave portion;

irradiating the photosensitive composition layer through the support film to form a resin composition layer;

heat treating the resin composition layer without fully curing the resin composition layer;

peeling the support film from the heat-treated resin composition layer; and further heat treating to fully cure the resin composition layer after peeling the support film to form the top plate portion.

2. The method for forming the precision fine space according to claim 1, wherein a film having a vertical shrinkage rate of 1% or less when heated at 100° C. for 30 minutes is used as the support film.

3. The method for forming the precision fine space according to claim 1, wherein a chemically amplified negative photosensitive resin composition is used as the photosensitive composition which constitutes the photosensitive composition layer.

4. The method for forming the precision fine space according to claim 3, wherein a photosensitive resin composition containing at least a multifunctional epoxy resin and a cation polymerization initiator is used as the chemically amplified negative photosensitive resin composition.

5. The method for forming the precision fine space according to claim 4, wherein at least one selected from the group consisting of aromatic diazonium salts, aromatic sulfonium salts, aromatic iodonium salts, metallocene based compounds, aromatic phosphonium salts and silanol aluminium complexes is used as the cation polymerization initiator.

6. The method for forming the precision fine space according to claim 4, wherein at least one of two aromatic sulfonium salts represented by the following general formulae (1) and (2), respectively:

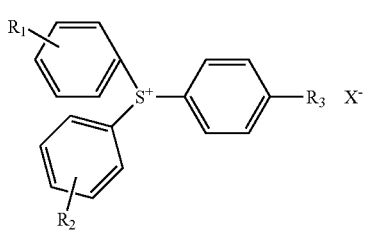

(1)

X = SbF$_6$ or PF$_6$

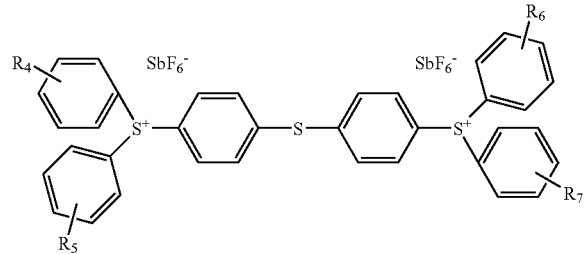

(2)

(in the formula, $R_1$, $R_2$, $R_4$, $R_5$, $R_6$, and $R_7$ represent hydrocarbon groups which may contain hydrogen, oxygen or halogen atoms, or alkoxy groups to which substituents may bond, and may be the same or different one another; and $R_3$ represents a hydrocarbon group which may contain hydrogen, oxygen or halogen atoms) is used as the cation polymerization initiator.

7. The method for forming the precision fine space according to claim 4, wherein at least one of two aromatic iodonium salts represented by the following general formulae (3) and (4), respectively:

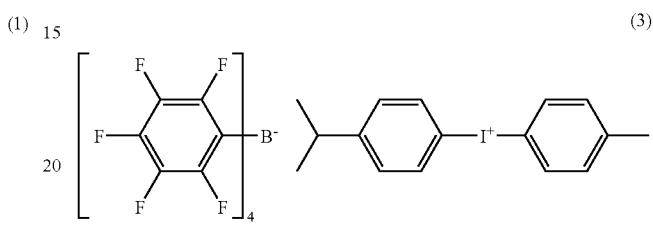

(3)

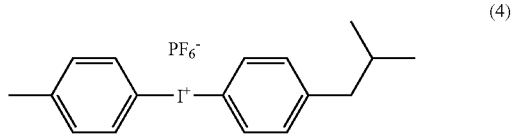

(4)

is used as the cation polymerization initiator.

8. The method for forming the precision fine space according to claim 1, wherein the precision fine space is an ink jetting nozzle space of an inkjet recording head.

* * * * *